United States Patent [19]
Freiberger et al.

[11] Patent Number: 5,104,819
[45] Date of Patent: Apr. 14, 1992

[54] FABRICATION OF INTERPOLY DIELCTRIC FOR EPROM-RELATED TECHNOLOGIES

[75] Inventors: Philip E. Freiberger, Santa Clara, Calif.; Leopoldo D. Yau, Portland, Oreg.; Cheng-Sheng Pan, Sunnyvale; George E. Sery, San Franciso, both of Calif.

[73] Assignee: Intel Corporation, Santa Clara, Calif.

[21] Appl. No.: 390,158

[22] Filed: Aug. 7, 1989

[51] Int. Cl.$^5$ .................... H01L 21/265; H01L 21/76
[52] U.S. Cl. ........................ 437/43; 437/195; 437/920; 437/978
[58] Field of Search ............... 437/42, 43, 49, 191, 437/195, 978, 920, 52; 148/DIG. 156, DIG. 109; 357/54, 23.14

[56] References Cited

U.S. PATENT DOCUMENTS

| | | | |
|---|---|---|---|
| 4,613,956 | 9/1986 | Paterson et al. | 357/23.5 |
| 4,616,402 | 10/1986 | Mori | 437/52 |
| 4,630,086 | 12/1986 | Sato et al. | 357/23.5 |
| 4,720,323 | 1/1988 | Sato | 437/69 |
| 4,769,340 | 9/1988 | Chang et al. | 437/26 |
| 4,808,261 | 2/1989 | Ghidini et al. | 437/191 |
| 4,926,222 | 5/1990 | Kosa et al. | 357/54 |
| 4,943,836 | 7/1990 | Mori | 357/23.5 |

FOREIGN PATENT DOCUMENTS

| | | | |
|---|---|---|---|
| 0294864 | 12/1988 | European Pat. Off. | 437/42 |
| 0200755 | 9/1987 | Japan | 437/191 |

OTHER PUBLICATIONS

"Determination of the Fowler-Nordheim Tunneling Barrier from Nitride to Oxide in Oxide:Nitride Dual Dielectric", by Leo D. Yau, IEEE Electron Device Letters, vol. EDL-7, No. 6, Jun., 1986; pp. 365-367.

S. Mori et al., "Novel Process and device technologies for submicron 4 Mb CMOS EPROMS", 1987 International Electron Devices Meeting, IEDM, Dec. 1987.

Primary Examiner—Brian E. Hearn
Assistant Examiner—C. Chaudhari
Attorney, Agent, or Firm—Blakely, Sokoloff, Taylor & Zafman

[57] ABSTRACT

A method and a device formed by the method of forming a composite dielectric structure between the floating polysilicon electrode and the control electrode of an EPROM-type device is disclosed. The dielectic is characterized by a thin (0–80 angstroms) thermally-grown or CVD bottom oxide layer covered by a relatively thin (<200 angstroms) silicon nitride layer. The top layer comprises a CVD oxide deposited in a thickness up to 150 angstroms. The capacitively measured effective thickness of the complete structure is about 200 Å or less. The top layer CVD oxide has a thickness greater than the bottom oxide layer and greater than or equal to that of the silicon nitride layer and may also extend beyond the EPROM cell to form at least a part of the peripheral transistor dielectric.

19 Claims, 6 Drawing Sheets

FIG_1A (PRIOR ART)

FIG_1B (PRIOR ART)

FIG_2A

FIG_2B

FIG_4

SINGLE CELL CHARGE LOSS VS. CHANGE IN VT WITH PROGRAMMING

- ○ POLYOX (800°@ 4 MIN.)/ NITRIDE (100Å)/ HTO(~100Å)
- □ POLYOX (800°@ 4 MIN.)/ NITRIDE (150Å)/ HTO(~100Å)
- △ POLYOX (800°@ 4 MIN.)/ NITRIDE (200Å)/ HTO(~100Å)

FIG_5B

FIG_5A

□ 30/200/35 (TOP)
△ 30/150/100 (TOP)

FIG_6

EPROM CELL ARRAY

- 43 V_G
- 42 (POLY 2)
- 40
- 39
- 38
- 35 (POLY 1)
- 33
- 34
- N+ 31

N-CHANNEL PERIPHERAL TRANSISTOR

- 44 (POLY 2)
- 40
- 45
- N+
- N+

P-SUBSTRATE 30 ions of Interpoly Dielectric for EPROM-Related Technologies

FABRICATION OF INTERPOLY DIELCTRIC FOR EPROM-RELATED TECHNOLOGIES

FIELD OF THE INVENTION

The present invention relates to the fabrication of dielectrics which form insulative layers in semiconductor devices. More particularly, the present invention relates to the formation of an interpoly dielectric material used to separate first and second polysilicon layers in electrically programmable read-only memory (EPROM) devices.

BACKGROUND OF THE INVENTION

Memory cells which have members that may be electrically charged are well-known in the prior art. Most often, these cells employ polysilicon floating gates which are completely surrounded by insulation (e.g., silicon dioxide). A charge is transferred to these floating gates through a variety of mechanisms such as avalanche injection, channel injection, tunnelling, etc.

The charge on the floating gate affects the surface channel conductivity in the cell. If the conductivity is above a certain level, the cell is deemed to be programmed in one binary state, and if the conductivity is below another level, it is deemed to be programmed in the other binary state. These memory cells take a variety of forms in the prior art, some being both electrically erasable and electrically programmable and others requiring, for example, ultraviolet light for erasing. The cells are incorporated into memories referred to in the prior art as EPROMs, EEPROMs, flash EPROMs and flash EEPROMs.

One of the most critical dielectrics for charge retention in an EPROM cell is the interpoly dielectric. This dielectric functions to insulate the floating gate (which is formed as a first polysilicon layer) from the control gate (which is usually formed as a second polysilicon layer) for charge storage purposes.

By way of example, during programming of an EPROM device the control gate is taken to a high positive potential ranging between 12-20 volts. When this high programming potential is supplied to the control gate the interpoly dielectric must be sufficiently strong (i.e., a high breakdown voltage) to block the Fowler-Nordheim (FN) tunneling of electrons from the floating gate to the control gate to prevent charge loss. Charge loss is a major reliability problem in EPROM-related devices.

Concurrent with the need to effectively isolate the floating gate from the control gate is the desire to scale or shrink the device as small as possible to increase overall circuit density. As is done in conventional transistor scaling, dielectrics are typically thinned to improve the performance of electrically programmable memories. Recall that the interpoly dielectric forms a capacitor in series with the gate capacitance. Any voltage applied to the control electrode will be capacitively shared with the floating gate electrode. For a given control gate voltage the capacitive coupling determines the voltage seen on the floating gate and thus the electrical performance of the transistor. Therefore, a very thin dielectric provides optimum transistor performance from a capacitance coupling perspective.

Thin dielectrics, however, have been the source of many problems in prior art processes. Chief among them is the fact that a thin dielectric presents a smaller potential barrier to electrons attracted to the positively-charged control gate.

The present invention provides a reliable interpoly dielectric which overcomes the problems of intrinsic charge loss in EPROM devices. The electrical properties of the invented dielectric structure allow a substantial capacitance increase for a given horizontal capacitor dimension (e.g., the floating gate and/or control gate dimension). This increased capacitance enhances the capacitive coupling between the control gate and the floating gate while providing greater charge retention than previous methods.

As will be seen, the invented structure is characterized by a relatively thick, chemically deposited (CVD) oxide film on top of an underlying nitride layer. Under a positive control gate potential, the thick CVD oxide provides a higher breakdown voltage than prior art approaches. The physical mechanism responsible for differences in positive versus negative carrier blocking potential is explained in an article entitled "Determination of the Fowler-Nordheim Tunneling Barrier from Nitride to Oxide in Oxide: Nitride Dual Dielectric", by Leo D. Yau, IEEE Electron Device Letters, Vol. EDL-7, No. 6, June, 1986; pp. 365-367.

SUMMARY OF THE INVENTION

In accordance with one embodiment of the invention, a method of fabricating a dielectric layer which inhibits intrinsic charge loss in EPROM-type devices is described. A first silicon dioxide layer is optionally grown or deposited on the floating polysilicon electrode of the device using conventional oxidation or CVD techniques. This first layer has a thickness in the range of 0-80 Å.

A silicon nitride layer is then deposited over the first silicon dioxide layer to a thickness of approximately 150 Å or less. Next, an oxide film is chemically deposited (CVD) over the nitride layer to a thickness of about 50-150 Å. This is optionally followed by an anneal in inert or oxidizing ambient to improve the composite dielectric quality. A control gate electrode is formed over the top of the CVD oxide film to complete the dielectric structure.

Thus formed, the dielectric is characterized as an oxide/nitride/oxide (ONO) composite in which the top oxide film is relatively thick when compared to the underlying oxide and nitride layers. This structure is referred to as an inverted asymmetrical ONO composite dielectric. Altogether, the capacitively measured effective thickness of the invented dielectric is about 200 Å or less.

The relatively thick CVD oxide film over the nitride may be extended beyond the edges of the EPROM cell to form at least a portion of the gate dielectric of the peripheral transistors.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DESCRIPTION OF THE PRIOR ART

In the past, standard methods for fabricating interpoly dielectrics consisted of one of two approaches: an oxide-only dielectric or a composite dielectric consisting of an oxide/nitride/oxide (ONO) sandwich.

In the oxide-only approach, the floating polysilicon electrode is thermally oxidized to form a silicon dioxide layer having a thickness which provides the necessary capacitive coupling. Typically, such oxides are grown to a thickness of greater than 300 Å.

The main drawback to this approach is that thermally grown oxide over polysilicon has a relatively low breakdown voltage. Furthermore, as the oxide is gradually thinned (e.g., during scaling) a tendency towards higher oxide defects arises. This fact generally limits the thickness to no less than 300 Å. Oxide-only films in the range of 120–240 Å have not yet been produced commercially for EPROM-related technologies.

In the ONO approach, the floating polysilicon electrode is first oxidized to form a silicon dioxide layer. A silicon nitride film is then deposited in a low pressure chemical vapor deposition (LPCVD) system. Following the deposition, the silicon nitride is itself thermally oxidized to form a thin oxide top layer. The thickness of the first and second layers are adjusted within processing constraints to provide the necessary capacitive coupling.

Figure 1A:
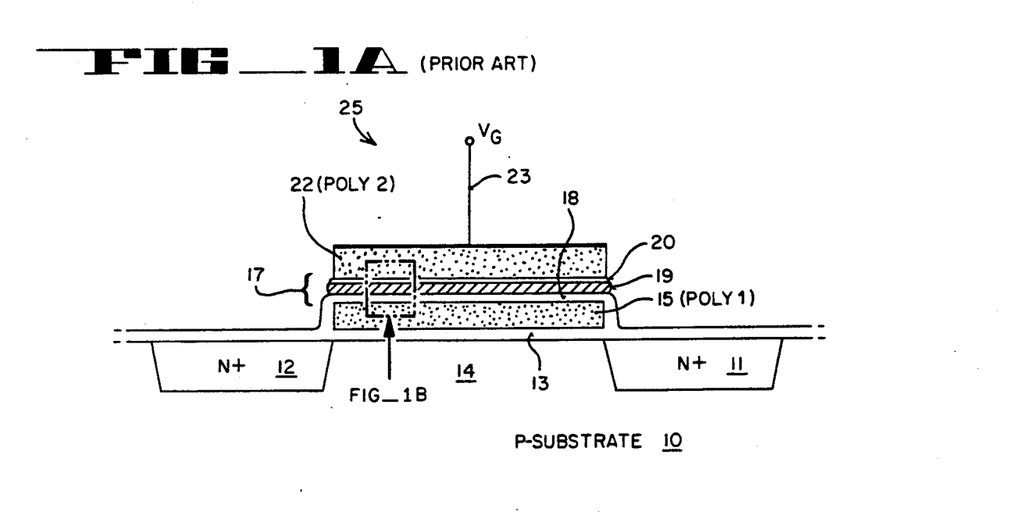
FIG. 1A shows a cross-section of an EPROM cell incorporating a prior art dielectric layer.
Figure 1B:
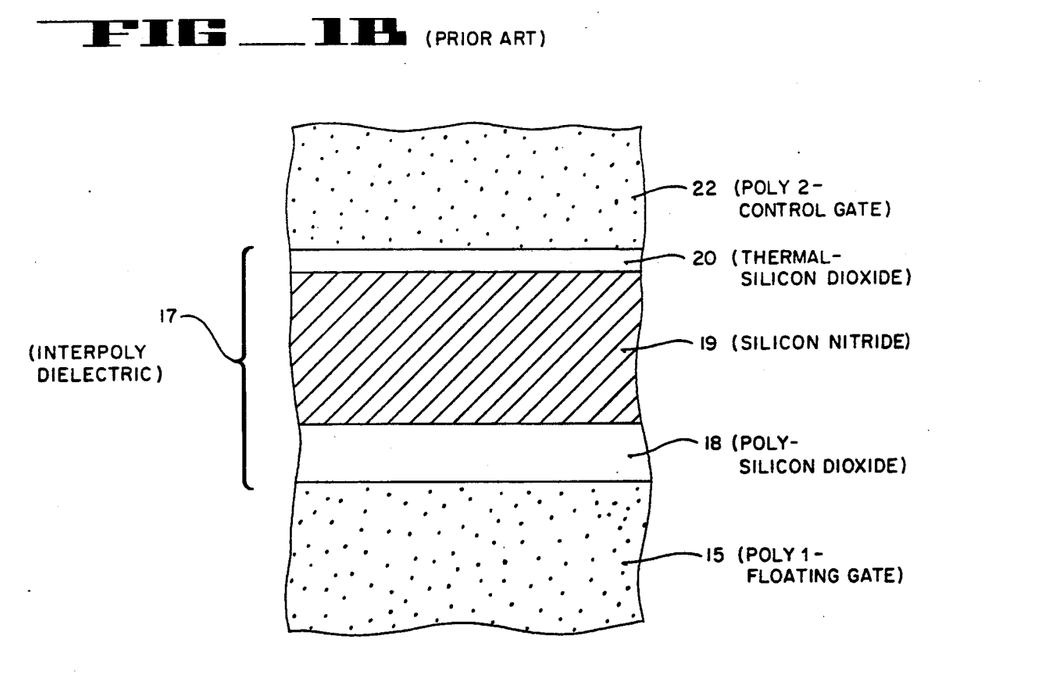
FIG. 1B shows an expanded view of the interpoly dielectric layer and the relationships between each of the composite oxide elements.

Referring to FIGS. 1A and 1B, a cross-sectional view of a prior art EPROM cell is shown. In this structure, the two operational states of a cell are defined by whether charge has been injected and trapped on the floating polysilicon gate.

As is well-known in the field, EPROM cell 25 comprises spaced apart N+ regions 12 and 11 formed in a P-type substrate 10. These N+ regions form the source and drain of the device and define a channel 14 there between. A thin gate oxide 13 insulates the floating gate 15 from the underlying substrate 10.

Floating gate 15 is made up of a poly-crystalline material which is insulated from the substrate by gate oxide 13 and from the control gate 22 by interpoly dielectric 17. Once charge has been injected onto the floating gate through hot electron programming, enough of it must be retained for the EPROM to function properly (e.g., read as programmed) during its lifetime, which may be greater than 20 years. The charge loss rate, therefore, must be less than two electrons per hour to meet this requirement. Conventional ONO interpoly dielectric structures are described in an article entitled "Poly-Oxide/Nitride/Oxide Structures For Highly Reliable EPROM Cells" by S. Mori et al., VLSI Tech. Dig., 1984; and in U.S. Pat. No. 4,577,390 of Hakem.

With the background provided above, the structure of FIGS. 1A and 1B may now be described in more detail. Conventional ONO formation begins with a partial pressure chlorinated oxidation of the first polycrystalline silicon layer 15 (poly ox). As described by S. Mori et al., conventional polysilicon dioxide layer 18 is usually grown to a thickness between 200–400 Å. The growth of poly ox 18 is followe an LPCVD silicon nitride deposition which forms nitride layer 19. Currently, the thickness of this nitride layer may be found to be anywhere between 100–250 Å thick. Steam re-oxidation of nitride layer 19 grows a thin thermal silicon dioxide top layer 20. Since nitride layer 20 is difficult to oxidize, the thickness of layer 20 is usually limited to 30–40 Å.

An important aspect of past approaches is that the formation of nitride oxide (Nox) layer 20 is a self-limiting oxidation process step. This means that the conversion of nitride to oxide places an effective limitation of approximately 200 Å as the minimum thickness that the nitride layer 19 may assume. Below the 200 Å level, a rapid fall off in device yield results.

Altogether, the major drawbacks to the prior art ONO processes can be summarized as follows. The thermal oxidation of silicon nitride provides an oxide layer that is limited to less than 40 Å. This portion of the composite dielectric has been determined to be under the highest field during normal EPROM programming. To realize the total effective thickness needed for scaled technologies, the prior art ONO structure of FIGS. 1A and 1B do not meet industrial standard defect criteria under normal operating conditions.

Moreover, the thermal oxidation of the silicon nitride sets a lower limit to the thickness of the nitride layer. For thicknesses below this minimum, the silicon nitride no longer provides a barrier to the oxidation of the underlying floating gate electrode. Thus, if an attempt is made to reduce the silicon nitride layer below the minimum of about 200 Å, oxidation of polysilicon layer 15 proceeds in an uncontrolled manner resulting in a loss of capacitive coupling.

Another disadvantage of the prior approach is that part of the charge stored on floating gate 15 is lost during the normal operating life of the EPROM. (A portion of this loss is actually the movement of charge trapped in silicon nitride layer 19 under the built-in field of a programmed cell.) The magnitude of this loss is proportional to the relative thickness of the nitride layer and the first silicon dioxide layer 18. Minimizing this element of intrinsic charge loss would require thinning of nitride layer 19 to a thickness which is beyond the limitations described above. In other words, with the prior art ONO structure of FIGS. 1A and 1B—in which a relatively thin thermal oxide layer 20 is formed above nitride layer 19—a scaled EPROM device meeting capacitive coupling requirements could not be produced without excessive yield loss.

Finally, the limited thickness of the oxide layer 20 grown on nitride layer 19 does not form an effective barrier to the charge that is present throughout layer 19. For conventional EPROMs in which a high positive voltage is applied to the control gate 22 during programming, layer 20 is simply too thin to prevent transfer or migration of charge from either the floating gate or nitride layer 19 to the control gate 22. Therefore, charge eventually passes out at the ONO dielectric through the thermal oxide. This increases the long-term intrinsic charge loss in prior art devices.

DESCRIPTION OF THE PREFERRED EMBODIMENT(S)

The present invention covers a reliable interpoly dielectric fabricated as a composite ONO structure in which a capacitively measured effective oxide thickness of about 200 Å or less is achieved. In the following description, numerous specific details are set forth, such as thicknesses, temperatures, etc., in order to provide a thorough understanding of the present invention. It will be obvious, however, to one skilled in the art that these specific details may not be required to practice the present invention. In other instances, well-known processing steps have not been described in detail in order not to unnecessarily obscure the present invention.

Figure 2A:
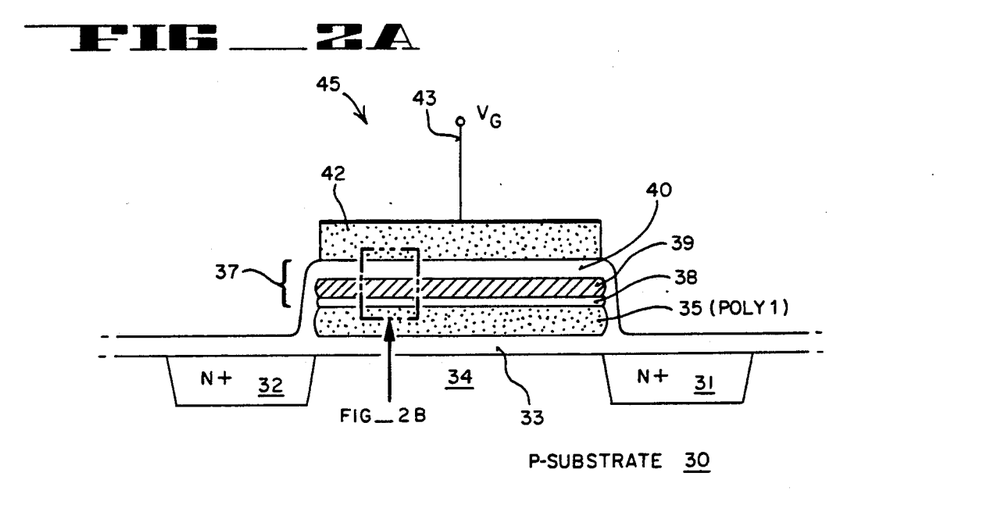
FIG. 2A shows a cross-section for an EPROM cell incorporating the interpoly dielectric of the currently preferred embodiment of the present invention.
Figure 2B:
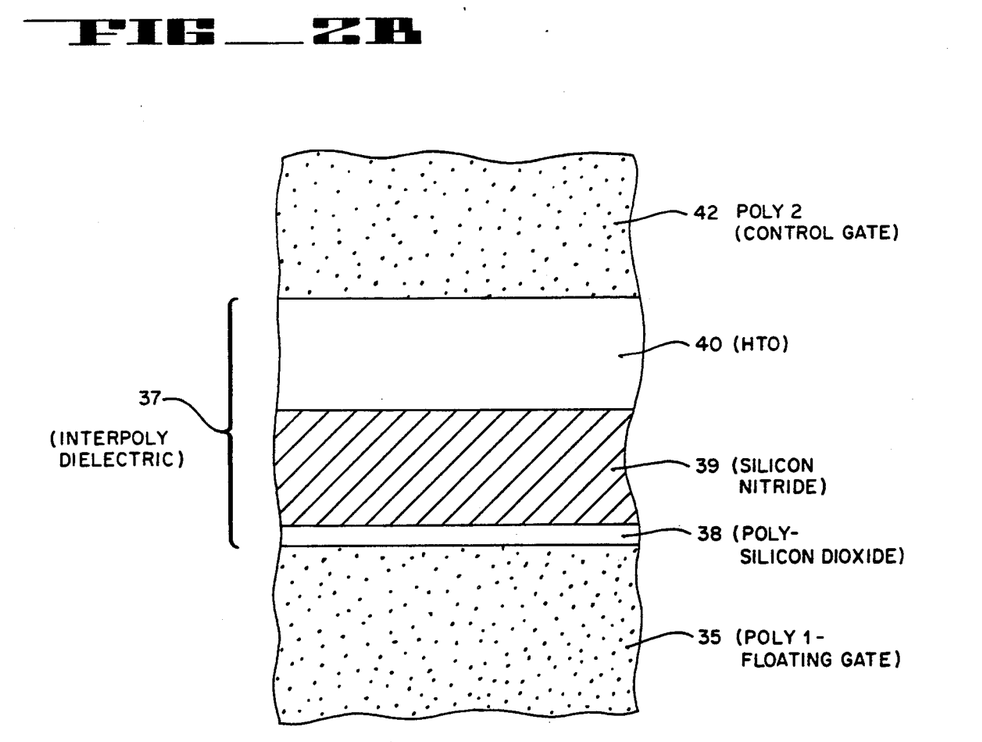
FIG. 2B shows an expanded view of that dielectric of the presently invented dielectric illustrating the relative thicknesses between each of the three layers.

Referring to FIGS. 2A and 2B, the currently preferred embodiment of the present invention is shown. The ONO structure of FIGS. 2A and 2B comprise a floating gate 35 which is made of a poly-crystalline silicon material. The floating gate 35 is insulated from P substrate 30 by a thin gate oxide layer 33 and from control gate 42 by composite dielectric layer 37. Control gate 42 preferably comprises polysilicon and is formed after completion of the interpoly dielectric. Control gate 42 is coupled to electrode 43 which is used to apply a positive programming potential $V_G$.

From bottom to top, interpoly dielectric 37 comprises silicon dioxide layer 38 followed by a deposited silicon nitride layer 39. Layer 38 may comprise either a CVD or thermally grown layer. A relatively thick CVD oxide film 40 is then deposited over nitride layer 39. In the preferred embodiment, film 40 is deposited using a high temperature oxidation (HTO) process. Details of the processing steps used to form layers 38–40 in the preferred embodiment, as well as their relative thicknesses, will be described later.

Of course, EPROM device 45 also comprises spaced-apart N+ regions 32 and 31 formed in P substrate 30. Channel 34 is defined by regions 31 and 32 which make up the source and drain regions of the EPROM cell.

It should be appreciated that the method of forming the interpoly dielectrics of the present invention may be incorporated within numerous different processes for fabricating EPROM devices. For instance, regions 31 and 32 may be formed either by ordinary diffusion or by ion implantation—either before or after the interpoly dielectric layers have been completely formed. According to the process flow used in the preferred embodiment, regions 31 and 32 are formed by ion implantation using a self-aligned method in which implantation occurs after the formation of both polysilicon gates.

To the ordinary practitioner the presently invented dielectric is seen to differ from the prior art ONO structure in several important respects. Most noticeably, the thermal oxidation of the deposited silicon nitride layer is replaced by a deposited HTO silicon dioxide layer in the thickness range of 60–150 Å. In the preferred embodiment, the deposition for the HTO oxide takes place using a high temperature LPCVD silicon dioxide deposition system. Of course, low temperature CVD oxides work equally as well and may be substituted without departing from the scope of the present invention.

A key aspect of the invention is that HTO film 40 does not depend on converting the silicon nitride to oxide; thus the limitation on top oxide layer thickness is removed. The quality of HTO oxide film 40 is equivalent to that of film thermally grown silicon dioxide in single crystalline form. Because of its relative thickness, HTO oxide film 40 forms a high potential barrier to the charge resident in both the silicon nitride and first polysilicon layer. This high potential barrier is very effective at limiting long-term charge loss in the device.

Another important feature of the invented dielectric is that the thickness of silicon nitride layer 39 is not confined to a minimum thickness to withstand thermal oxidation. Therefore it may be thinned down to the range of 50–120 Å. The ability to be able to thin the nitride, without resulting yield loss, enhances the capacitive coupling between control gate 42 and floating gate 35.

Also, by utilizing a relatively thick top layer of HTO silicon dioxide, the thickness of bottom oxide layer 38 (grown by oxidizing polysilicon layer 35) becomes non-critical and can vary anywhere between 0–80 Å to meet capacitive coupling goals. (As a practical point, oxide thicknesses of 0 Å are virtually impossible to achieve since polysilicon will quickly oxidize to a thickness of about 10–20 Å in a high temperature environment.) To achieve 0 Å, the unintentional poly-ox can be removed in-situ by flowing HCL hot gas prior to flowing the gases used in forming the nitride layer.

Taken as a whole, the invented structure of FIGS. 2A and 2B is characterized by a relatively thin polysilicon dioxide layer 38 followed by a reduced thickness silicon nitride layer 39. Nitride layer 39 is followed by a relatively thick HTO film 40 which acts to substantially reduce intrinsic charge loss phenomena. The use of deposited HTO layer 40 also removes the limitations to either increase the thickness of the top oxide layer and/or reduce the underlying nitride thickness. For about the same electrical capacitance, the combination of a relatively thick HTO film and a relatively thin nitride layer improves blocking of the electron charge when a positive program voltage is applied to the control gate of the device.

The pertinent processing steps of the currently preferred embodiment are described as follows and summarized in Table 1.

Formation of the interpoly dielectric 37 begins with the oxidation of polysilicon floating gate 35. (Alternatively, the poly-ox may be formed using CVD techniques to reduce defects.) This is carried out by subjecting floating gate 35 to an 800° C. dry (thermal) bake for approximately 10-minutes. This forms a silicon dioxide layer having a thickness of approximately 40 Å. As mentioned above, poly oxidation is an optional step to the presently invented method. It may be replaced by a CVD oxide or reduced to 0 Å by an in-situ hot HCl gas etch prior to the silicon nitride deposition.

Next in the sequence is the deposition of silicon nitride layer 39. Preferably, nitride layer 39 is deposited to a thickness of approximately 100 Å in a furnace at about 700° C. for 20 minutes. The forming gas used is a combination of ammonia ($NH_3$) and dichlorosilane ($SiCl_2H_2$) mixed in a ratio of 10:1, respectively. The pressure of the gas in the furnace is maintained at about 200 millitorr. Obviously, there are many other possible recipes for depositing silicon nitride which produce equivalent results.

Deposition of the top HTO oxide layer 40 occurs in a furnace for 30 minutes at 775° C. (nominal). The forming gas is a mixture of $N_2O$ and $SiCl_2H_2$ in a ratio of 8:1, respectively. The pressure within the furnace is kept at approximately 400 millitorr. Under these conditions, a 30 minute deposition produces approximately 100 Å of HTO oxide. Thicknesses up to 150 Å may be produced simply by extending the deposition time. It should be pointed out that having a nitride layer beneath the HTO film prevents further increase in the film's thickness during subsequent processing. According to the preferred method of fabricating the ONO structure of the present invention, a capacitively measured effective dielectric thickness of less than 200 angstroms is produced.

TABLE 1

| Processing Step: |
| --- |
| 1. Growth of gate oxide (100–200Å) |
| 2. Polysilicon deposition-Poly I (1500Å) |
| 3. Ion implantation of Poly I using a dose of 4 × 10$^{15}$ phosphorus at 30 keV |
| 4. Poly I - oxidation: (optional) |
|    temperature = 800° C.; |
|    time = ~10 min; |
|    atmosphere = ~11% $O_2$ |
|    target = ~40Å of $SiO_2$ on Poly I |
| 5. Silicon Nitride Deposition: |
|    temperature = 700° C.; |
|    atmosphere = 10:1 ratio of $NH_3/SiH_2Cl_2$ |
|    pressure = 200 millitorr |
|    time = ~20 minutes |
|    target = ~100Å |
| 6. High Temperature Oxide (HTO) Deposition: |
|    temperature = 775° C. (nominal) |
|    atmosphere = 8:1 ratio of $N_2O/SiH_2Cl_2$ |
|    pressure = 400 millitorr |
|    time = ~30 minutes for 100Å |
|    950° C. anneal for 30 min. in $N_2$ or $N_2 + O_2$ (Optional) |
| 7. Poly I masking to define floating gate of device |

Figure 3:
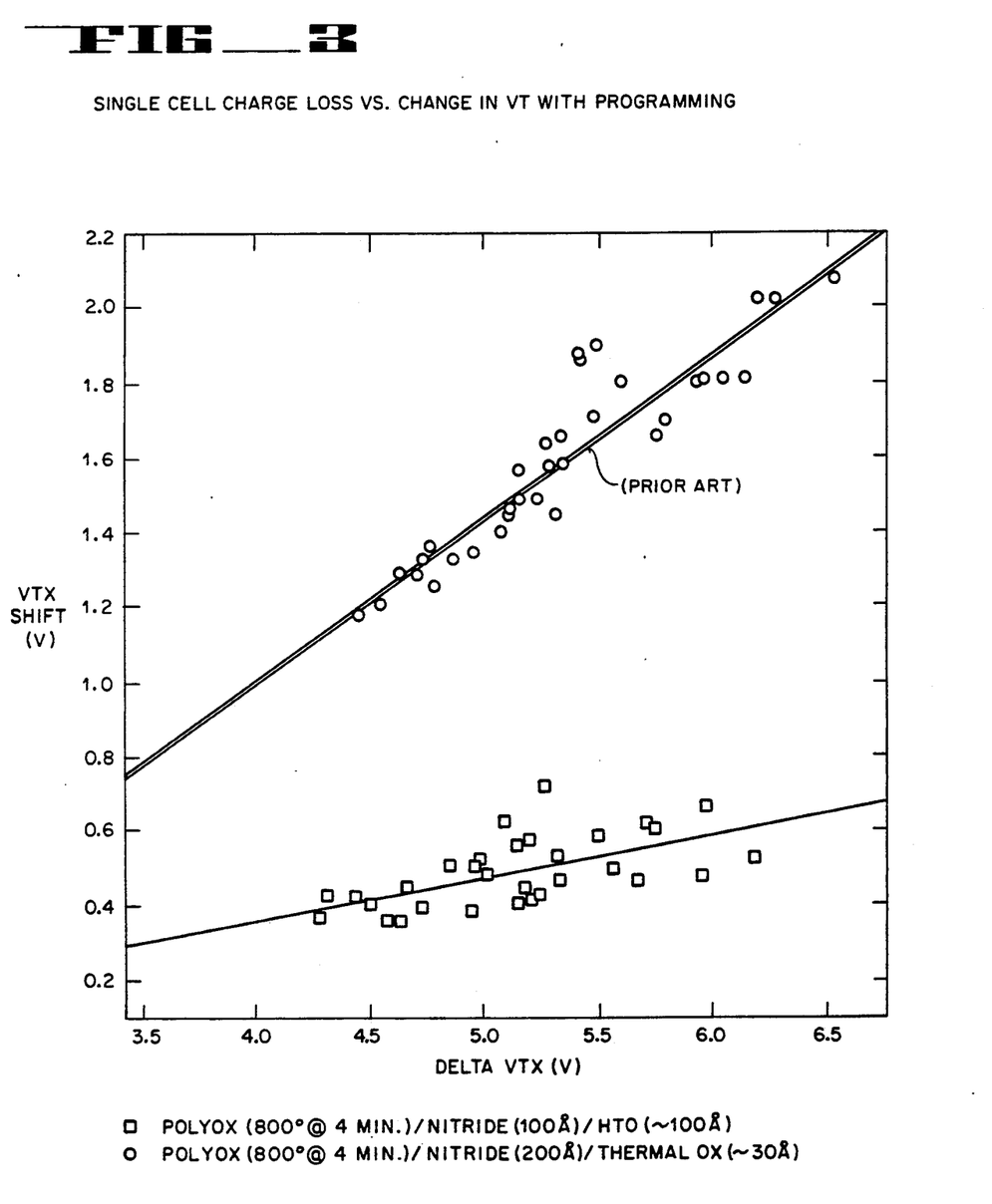
FIG. 3 shows the charge loss associated with the single cell versus the change in threshold voltage with programming for a prior art EPROM cell and an EPROM cell incorporating the structure of the present invention.

FIG. 3 illustrates two plots of programmed threshold voltage loss ($V_{TX}$ shift) during a 500 hour, 250° C. retention bake (i.e., charge loss) versus the change in threshold with programming (i.e., delta $V_{TX}$). Delta $V_{TX}$ represents the difference between the erase threshold and the threshold after programming. This is a measure of the charge stored on the cell during programming.

The results for FIG. 3 were obtained from test structure EPROM cells fabricated according to the prior art process and according to the presently invented method for formation of the interpoly dielectric structure. The circles represent the prior art device which includes a polyoxide layer grown at 800° C. for four minutes followed by a 200 Å nitride deposition and a 30 Å grown thermal oxide layer.

The squares of FIG. 3 represent the data taken from the presently invented structure having a poly ox layer grown at 800° C. for four minutes followed by a 100 Å nitride deposition and a top HTO oxide film of approximately 100 Å. The data clearly demonstrates that minimizing nitride thickness while increasing a top layer oxide thickness, as taught by the present invention, minimizes intrinsic charge loss within the EPROM device.

Figure 4:
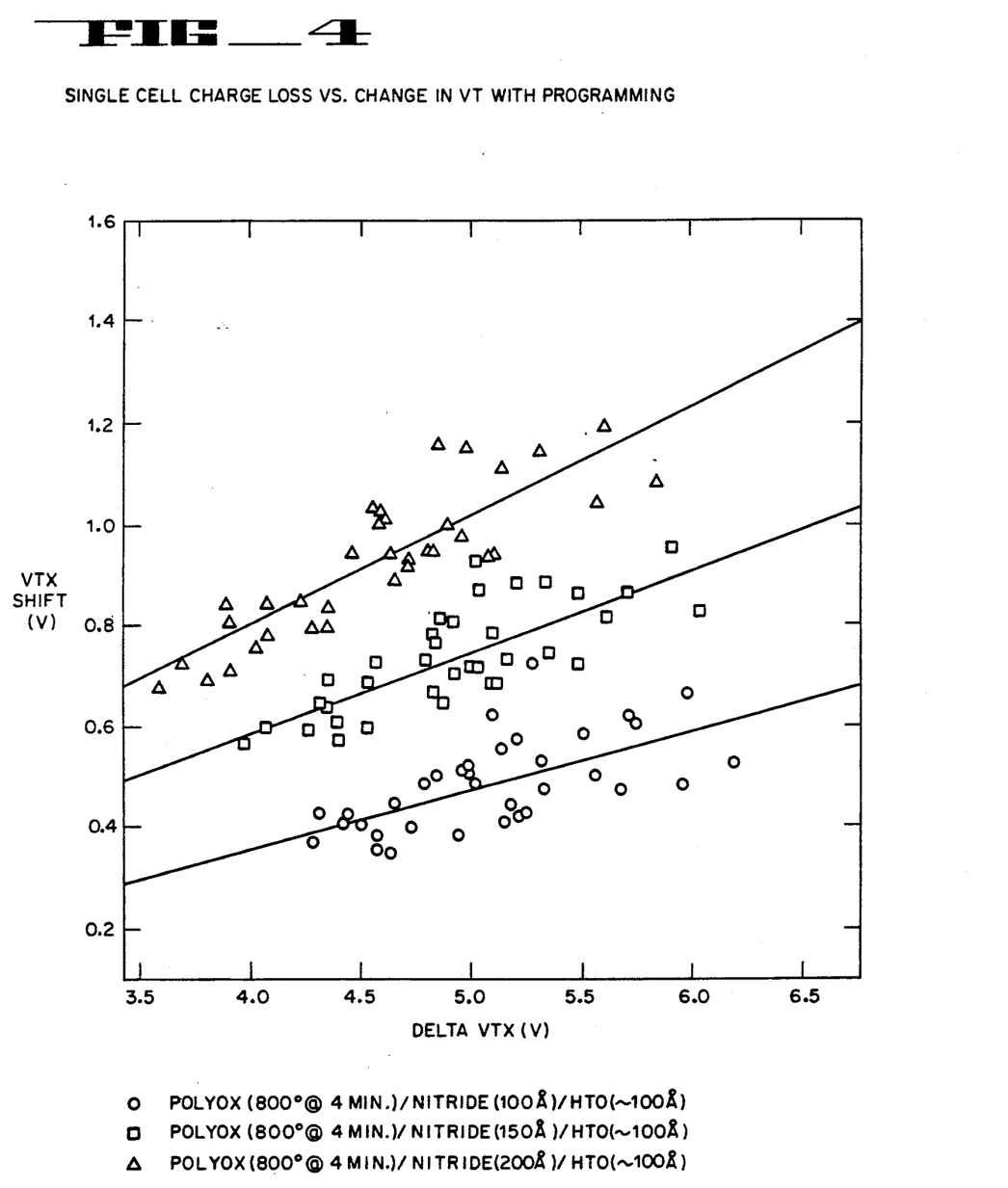
FIG. 4 shows the charge loss associated with the single cell versus the change in threshold voltage with programming for various alternative embodiments of the present invention.

In FIG. 4, three separate EPROM cells were built using the method of the present invention, but with different nitride thickness of 200 Å, 150 Å and 100 Å. FIG. 4 therefore illustrates how variations in nitride thickness—while maintaining the top HTO oxide film and bottom thermal oxide layer thicknesses constant—effects overall charge loss. The data demonstrates that charge loss is directly effected by nitride layer thickness. All other things being equal, a thinner silicon nitride layer corresponds to lower overall charge loss.

Other experiments have demonstrated that beyond the lower overall charge loss associated with the thinner nitride, the novel ONO stack of the present invention is less sensitive to variations in poly ox thickness. The charge loss increases about 0.1 volt per 50 Å decrease in polyoxide thickness when 100 Å of HTO top oxide is used compared to about 0.4 volts per 50 Å decrease for conventional ONO.

FIGS. 3 and 4 also demonstrate that the charge loss is a function of the change in threshold with programming. The higher the programming threshold, the more charge that has been injected and trapped onto the floating gate. This additional charge increases the built-in electric field of the cell.

Figure 5A:
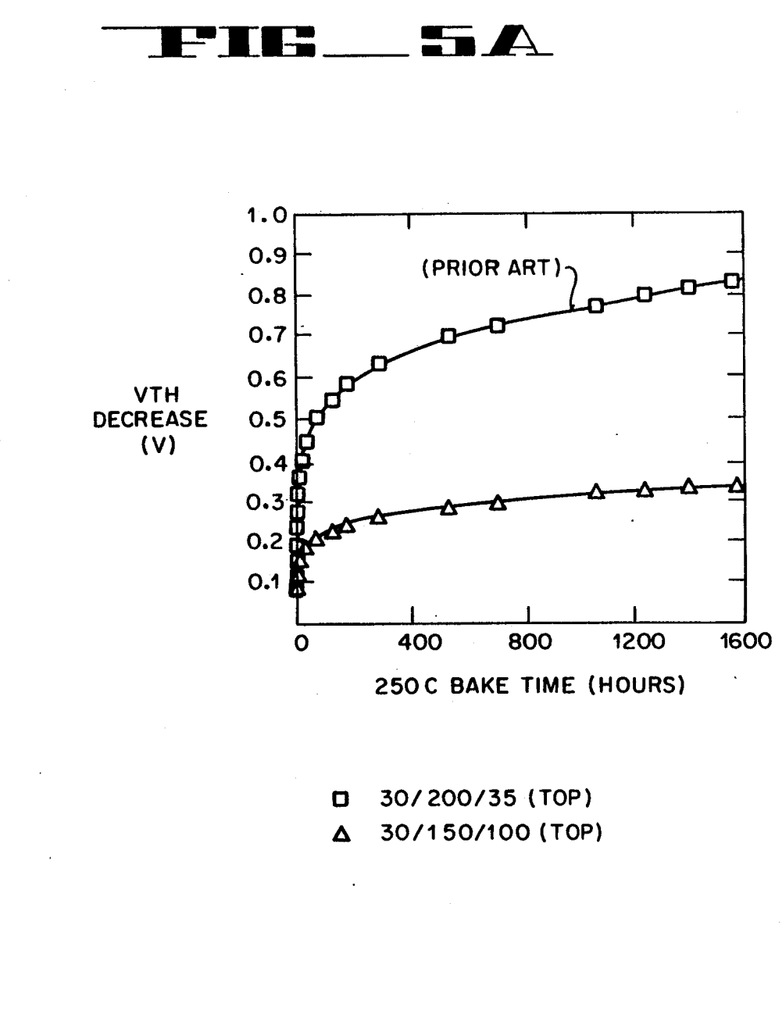
FIG. 5A illustrates the threshold voltage decrease versus 250° C. bake time for programmed EPROMs with various interpoly dielectric thicknesses.
Figure 5B:
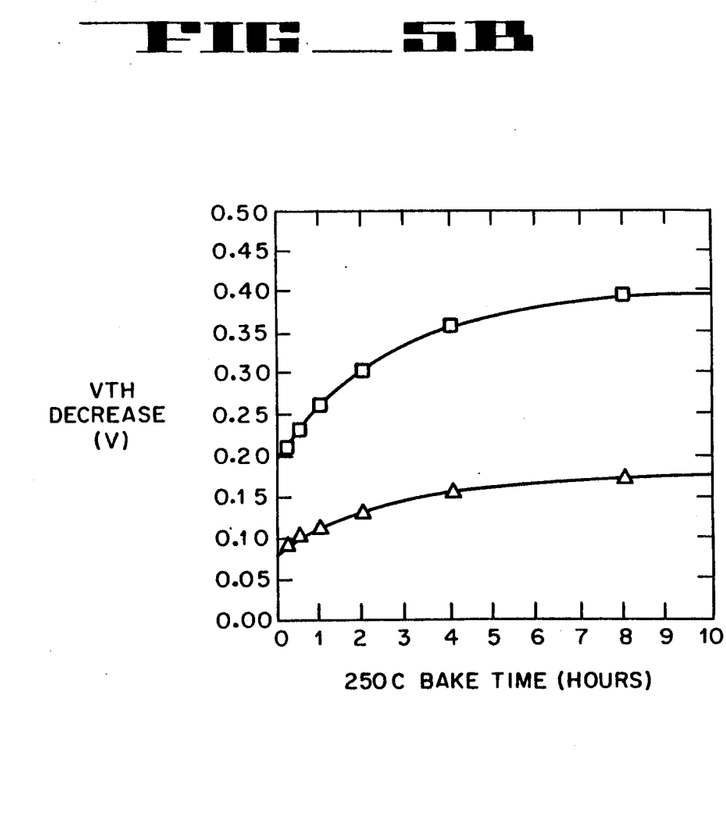
FIG. 5B shows an expanded view of the data of FIG. 5A for bake times between 0 and 10 hours.

Referring to FIGS. 5A and 5B, the threshold voltage decrease versus 500 hour, 250° C. bake for programmed EPROMs—having both the conventional ONO structure of the prior art and the presently invented structure of the preferred embodiment—are illustrated. The data represents the median shift of a 64K full EPROM device. Charge loss was measured on a bit by bit basis. FIG. 5A shows the long-term shift with data up to 1600 hours. FIG. 5B is an expanded view of the initial 10 hours of bake for FIG. 5A. This data illustrates several key features of the present invention.

First of all, intrinsic charge loss is seen to be a strong function of nitride thickness—the thinner nitride layer of the present invention showing marked suppression of charge loss as compared to the prior art ONO structure. Secondly, the thickness of the top oxide layer is shown to have a significant effect on the long-term charge loss. The novel ONO structure shows a much more saturating long-term phase than that of the conventional ONO. Finally, using the conventional ONO process, the reduction in bottom oxide thickness results in large increases in intrinsic charge loss. In contrast, according to the presently invented method the bottom oxide layer thickness may be kept very thin (or optionally eliminated) without adversely effecting intrinsic charge loss.

Figure 6:
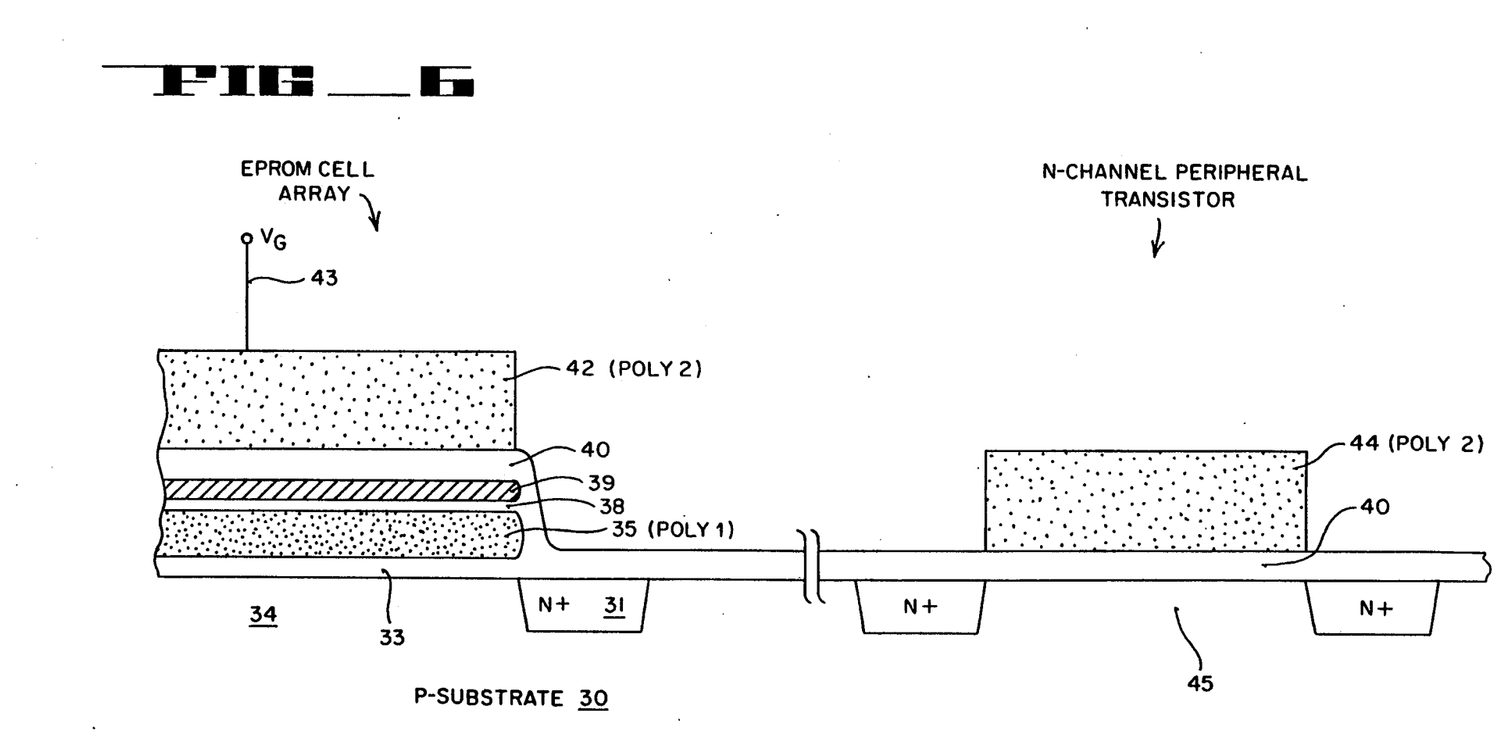
FIG. 6 shows an application of the present invention in which the relatively thick CVD oxide film is extended beyond the edge of the underlying nitride layer to simultaneously form a portion of the gate dielectric in a peripheral transistor.

FIG. 6 illustrates an application of the present invention in which the relatively thick CVD oxide film is extended beyond the edge of the underlying nitride layer to simultaneously form a portion of the gate dielectric in a peripheral transistor. As is clearly shown, HTO oxide film 40 forms part of the gate oxide of peripheral transistor 45 as it extends out from the top layer of the composite dielectric in the EPROM cell. The gate 44 of transistor 45 is defined out of the same poly 2 layer used to form the EPROM cell gate 42. Extension of film 40 is easily achieved by switching the HTO deposition and masking sequence in Table 1.

The transistor gate dielectric of the peripheral transistors for both p and n-channel devices may also be formed by first oxidizing the exposed silicon to form a thin thermal oxide (10–100 angstroms) then followed by the same HTO oxide used to form interpoly dielectric 37. The use of a relatively thick CVD oxide over the nitride permits the deployment of the CVD oxide over the peripheral transistor gate dielectric and the sidewalls of the poly 1 floating gate. The desired total dielectric thickness for transistor 45 is usually thicker than the HTO layer 40. To obtain the desired peripheral transistor dielectric thickness, the exposed silicon is first oxidized thermally (10–100 Å) and then the HTO 40 is deposited. (Note that during the thermal oxidation of exposed silicon substrate, the nitride 39 does not grow any appreciable oxide because nitride is resistant to oxidation.) Prior to poly 2 (44) deposition, the HTO may be annealed in inert (such as Ar or $N_2$) or partially oxidizing ($Ar+O_2$ or $N_2+O_2$) ambients.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. For example, as an alternative to thermally growing silicon dioxide on the floating gate electrode, an HTO oxide film may be deposited instead. Other CVD methods such as the use of TEOS or PECVD may alternatively replace the HTO. It is therefore contemplated that the appended claims cover any such alternations or modifications as fall within the scope and spirit of the invention.

Thus, a method for fabricating a reliable interpoly dielectric structure to minimize intrinsic charge loss in EPROM-related technologies has been described.

We claim:

1. In a semiconductor process for making an electrically programmable memory device, a method for fabricating a composite dielectric layer over a first polysilicon electrode to inhibit long-term charge loss in said device comprising the steps of:
   (a) forming a first silicon dioxide layer over said first polysilicon electrode;
   (b) depositing a silicon nitride layer over said first silicon dioxide layer, said silicon nitride layer being thicker than said first silicon dioxide layer;
   (c) depositing a second silicon dioxide layer over said nitride layer, said second oxide layer having a thickness which is greater than that of said first oxide layer and greater than or equal to that of said silicon nitride layer; and
   (d) forming a control gate over said second silicon dioxide layer;
said second silicon dioxide layer having sufficient thickness to substantially prevent charge loss from either said first polysilicon electrode or said silicon nitride layer when a high positive potential is applied to said control electrode.

2. The method of claim 1 wherein said second oxide layer is greater than 50 Å thick.

3. The method of claim 2 wherein said second oxide layer has a thickness of 50–150 Å, said silicon nitride layer has a thickness of 50–120 Å, and said first silicon dioxide layer has a thickness no greater than 80 Å.

4. The method of claim 3 wherein said control gate comprises polysilicon.

5. The method according to claim 2 wherein said composite dielectric has a capacitively measured effective oxide thickness of 200 Å or less.

6. In a semiconductor process for fabricating an electrically programmable memory device which includes the steps of:
   providing a substrate;
   forming a thin gate oxide over a portion of said substrate;
   depositing a first polysilicon layer over said thin gate oxide;
   forming a composite dielectric over said first polysilicon layer; and
   forming a control electrode over said dielectric;
   an improved method for forming said dielectric which reduces long-term charge loss in said device, said improved method comprising the steps of:
   (a) optionally forming a silicon dioxide layer over said first polysilicon electrode, said silicon dioxide layer being formed by oxidizing said first polysilicon layer;
   (b) depositing a silicon nitride layer over said silicon dioxide layer or said first polysilicon layer if no silicon dioxide is formed, said silicon nitride layer having a thickness of 150 Å or less; and
   (c) chemically depositing an oxide film over said nitride layer, said oxide film being substantially as thick as, or thicker than, said silicon nitride layer.

7. The method according to claim 6 wherein step (c) is performed in a furnace at a temperature exceeding 400° C.

8. The method according to claim 6 wherein said composite dielectric has a capacitively measured effective oxide thickness of 200 Å or less, said oxide film has a thickness of 50–150 Å, said silicon nitride layer has a thickness of 50–120 Å and said silicon dioxide layer has a thickness no greater than 80 Å.

9. The method according to claim 8 wherein said control electrode is comprised of polysilicon.

10. The method according to claim 6 wherein said oxide film has a thickness of 50–150 Å, said silicon nitride layer has a thickness of 50–120 Å and said silicon dioxide layer has a thickness no greater than 80 Å, further comprising the step of:
   (d) performing an anneal at a temperature exceeding 800° C. in an inert or partially oxidizing ambient.

11. In a semiconductor process for fabricating an electrically programmable memory device which includes the steps of:
   providing a substrate;
   forming a thin gate oxide over a portion of said substrate;
   depositing a first polysilicon layer over said thin gate oxide;
   forming a composite dielectric over said first polysilicon layer; and
   forming a control electrode over said composite dielectric;
   an improved method for forming said composite dielectric reduces long-term charge loss in said device, said improved method comprising the steps of:
   (a) optionally forming a silicon dioxide layer over said first polysilicon electrode;
   (b) depositing a silicon nitride layer over said silicon dioxide layer, said silicon nitride layer having a thickness of 150 Å or less; and
   (c) chemically depositing an oxide film over said nitride layer, said oxide film being substantially as thick as, or thicker than, said silicon nitride layer, wherein said oxide film also forms at least a portion of the gate dielectric of peripheral transistors, said gate dielectric comprises approximately 50–100 Å of said oxide deposited over approximately 10–100 Å of thermal oxide.

12. The method according to claim 11 further comprising the step of:
   (d) performing an anneal to a temperature exceeding 800° C. in an inert or partially oxidizing ambient.

13. In a semiconductor process for making an electrical programmable memory device, a method for fabricating a composite dielectric layer over a first polysilicon electrode to inhibit long-term charge loss in said device comprising the steps of:
   (a) forming a first silicon oxide layer over said first polysilicon electrode;
   (b) depositing a silicon nitride layer over said first silicon oxide layer, said silicon nitride layer being thicker than said first silicon dioxide layer;
   (c) depositing a second silicon dioxide layer over said nitride layer, said second oxide layer having a thickness which is greater than that of said first oxide layer and greater than or equal to that of said silicon nitride layer, said second oxide layer being at least 50 Å thick; and
   (d) forming a polysilicon control gate over said second silicon dioxide layer;
   said second silicon dioxide layer reducing charge loss from either said first polysilicon electrode or said silicon nitride layer when said control electrode is at a sufficiently high positive potential to program said device, and
   wherein said composite dielectric has a capacitively measured effective thickness of 200 Å or less.

14. The method of claim 13 wherein said second oxide layer has a thickness within the range 50–150 Å, said silicon nitride layer has thickness within the range of 50–120 Å, and said first silicon dioxide layer has a thickness of approximately 0–80 Å.

15. In a semiconductor process for fabricating an electrically programmable memory device which includes the steps of:
   providing a substrate;
   forming a thin gate oxide over a portion of said substrate;
   depositing a first polysilicon layer over said thin gate oxide;
   forming a composite dielectrical over said silicon layer; and forming a polysilicon control electrode over said composite dielectric;
   an improved method method for forming said composite dielectric which reduces long-term charge loss in said device, said improved method comprising the steps of:
   (a) optionally forming a silicon dioxide layer over said first polysilicon electrode by oxidizing said first polysilicon layer;
   (b) depositing a silicon nitride layer over said silicon dioxide layer, said silicon nitride layer having a thickness of 150 Å or less;
   (c) chemically depositing an oxide film over said nitride layer, said oxide film being at least as thick as said silicon nitride layer to reduce electron flow to said control electrode;
   (d) wherein said composite dielectric has a capacitively measured effect oxide thickness of 250 Å or less.

16. The method of claim 15 wherein said second oxide layer has a thickness of 50–150 Å, said silicon nitride layer has a thickness of 50–120 Å, and said first silicon dioxide layer has a thickness no greater than 80 Å.

17. The method according to claim 15 wherein said oxide film also form at least a portion of the gate dielectric of the peripheral transistors.

18. The method according to claim 17 wherein said gate dielectric comprises approximately 50–100 Å of said oxide deposited over approximately 10–100 Å of thermal oxide.

19. The method according to claim 18 further comprising the step of:
   (d) performing an anneal to a temperature exceeding 800° C. in an inert or partially oxidizing ambient.

* * * * *